United States Patent
Mascolo et al.

(10) Patent No.: US 7,456,508 B2
(45) Date of Patent: Nov. 25, 2008

(54) HOSTING STRUCTURE OF NANOMETRIC ELEMENTS AND CORRESPONDING MANUFACTURING METHOD

(75) Inventors: Danilo Mascolo, Ercolano (IT); Gianfranco Cerofolini, Milan (IT); Gianguido Rizzotto, Civate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 504 days.

(21) Appl. No.: 11/215,348

(22) Filed: Aug. 30, 2005

(65) Prior Publication Data

US 2007/0176208 A1 Aug. 2, 2007

(30) Foreign Application Priority Data

Aug. 31, 2004 (EP) .................. 04425648

(51) Int. Cl.
*H01L 27/10* (2006.01)
(52) U.S. Cl. ............... 257/900; 257/202; 257/E39; 257/E51.038; 257/E29.17; 977/712; 977/720; 977/722; 977/723
(58) Field of Classification Search ............. 257/202, 257/900; 977/712, 720, 722, 723
See application file for complete search history.

(56) References Cited

U.S. PATENT DOCUMENTS

| | | | |
|---|---|---|---|
| 5,262,336 A | 11/1993 | Pike, Jr. et al. | |
| 5,272,114 A | 12/1993 | van Berkum et al. | |
| 5,500,869 A | 3/1996 | Yoshida et al. | |
| 5,520,244 A | 5/1996 | Mundinger et al. | |
| 6,365,059 B1 | 4/2002 | Pechenik ................... 216/52 |
| 6,897,101 B2* | 5/2005 | Weitz ........................ 438/171 |
| 6,936,891 B2* | 8/2005 | Saito et al. ................ 257/331 |
| 7,142,772 B2 | 11/2006 | Blauvelt et al. | |
| 2002/0043690 A1 | 4/2002 | Doyle et al. ............... 257/368 |
| 2003/0059983 A1 | 3/2003 | Ota et al. .................. 438/128 |
| 2003/0104700 A1 | 6/2003 | Fleming et al. | |
| 2004/0146863 A1 | 7/2004 | Pisharody et al. ............. 435/6 |
| 2005/0152180 A1* | 7/2005 | Katti .......................... 365/158 |
| 2005/0249473 A1 | 11/2005 | Page et al. | |
| 2006/0051919 A1 | 3/2006 | Mascolo et al. | |

(Continued)

FOREIGN PATENT DOCUMENTS

DE 101 23 364 A1 11/2002

(Continued)

*Primary Examiner*—Wai-Sing Louie
*Assistant Examiner*—Marc Armand
(74) *Attorney, Agent, or Firm*—Lisa K. Jorgenson; Hai Hen; Seed IP Law Group PLLC

(57) ABSTRACT

A hosting structure of nanometric components is described comprising a substrate, a first multi-spacer level comprising a first plurality of spacers including first conductive spacers parallel to each other, and at least a second multi-spacer level realized above said first multi-spacer level and comprising a second plurality of spacers arranged transversally to said first plurality of spacers and including at least a lower discontinuous insulating layer and an upper layer, including in turn second conductive spacers. In particular, each pair of spacers of the second multi-spacer level defines with a spacer of the first multi-spacer level a plurality of nanometric hosting seats having at least a first and a second conduction terminal realized by portions of the first conductive spacers and of the second conductive spacers faced in the hosting seats. A method for manufacturing such a structure is also described.

37 Claims, 8 Drawing Sheets

U.S. PATENT DOCUMENTS

| | | |
|---|---|---|
| 2006/0113587 A1 | 6/2006 | Thies et al. |
| 2007/0051994 A1 | 3/2007 | Song et al. |

FOREIGN PATENT DOCUMENTS

| | | |
|---|---|---|
| DE | 102 47 679 A1 | 4/2004 |
| EP | 0 313 493 A2 | 4/1989 |
| EP | 1 278 234 A2 | 1/2003 |
| WO | WO 99/04440 | 1/1999 |
| WO | WO 02/35580 A2 | 5/2002 |
| WO | WO 02/37571 A1 | 5/2002 |
| WO | WO 03/005369 A2 | 1/2003 |

\* cited by examiner

HOSTING STRUCTURE OF NANOMETRIC ELEMENTS AND CORRESPONDING MANUFACTURING METHOD

BACKGROUND OF THE INVENTION

1. Field of the Invention

The present invention relates, in its more general aspect, to the field of the microelectronics with nanometric semiconductor electronic devices and to the field of the nano-manufacturing.

In particular, the invention relates to a hosting structure of nanometric components on parallel planes as it will be more apparent hereafter in the description, where it will be also simply indicated as nanometric structure.

Moreover, the invention relates to a manufacturing method of such a structure.

2. Description of the Related Art

As it is well known, in the field of the microelectronics the need of realizing circuit configurations of more and more reduced dimensions is particularly felt.

In the last thirty years, the progress of the electronic technology has followed a trend governed by that which is known as "Moore Law", an empirical law stating that the capacity of storing information in memory devices doubles each eighteen months approximately, whereas the calculation performance of the CPUs (Central Processing Units) improve of a factor two each twenty-four months, as reported in the scheme of FIG. 1.

The Moore law is based on the capacity of reducing the geometries of the considered devices and it highlights how dimensions have passed from being equal to 2 μm for the eighties technologies, to being equal to 130 nm in 2001, to currently being equal to 90 nm.

However, the current technology is quickly reaching the physical limits of its possibilities and this implies a limitation in the reduction of the dimensions of the electronic devices which can be realized. In particular, the currently used photolithography processes are subject to drastic dimensional limitations for dimensional values being lower than 100 nm.

Forward techniques have thus been developed such as x-ray non-optic lithography, extreme ultra-violet lithography and the electronic beam lithography which allow to realize circuit configurations with dimensions in the order of some tenths of nanometres.

These techniques, however, require complex instruments characterized by excessively long times of lithographic etching and they thus result too expensive for being applied to a mass industrial manufacturing.

As an alternative, sub-lithographic patterning techniques have been developed based on controlled (conformable) deposition and of selective removal of a functional material on a suitable layer for realizing nanometric elements.

These techniques have allowed the adjustment of methods for realizing semiconductor substrates suitable for obtaining different typologies of components, as for example indicated in the U.S. Pat. Nos. 6,570,220 and 6,063,688 both to Doyle et al.

In particular, in these patents a deep submicrometric structure is described for transistors and, respectively, a relative method for realizing it. This method provides the realization, on a silicon substrate by means of lithography, of first spacers in a first material whereon, by means of controlled deposition, a layer of a second material is realized. Moreover the thickness of the layer of the second material is approximately half the width of the first spacers.

The selective removal of the second material, carried out by means of anisotropic etching, thus defines second spacers each being adjacent to respective side portions of the first spacers, and each having width equal to the thickness of the layer of this second material.

With a successive selective chemical etching the first spacers are removed, leaving on the surface of the semiconductor substrate only the second spacers. The deposition of a layer of a third material, controlled in the thickness, followed by a selective removal with anisotropic etching, defines third spacers.

These third spacers, each adjacent to respective side portions of the second spacers, have a length equal to the thickness of the layer of the third material. With a selective chemical etching the second spacers are removed leaving on the surface of the semiconductor solely the third spacers.

The operations of controlled depositions, of anisotropic etching and of selective etching are repeated more than once, for realizing spacers of reduced width of 100 Å or less, separated from one another by a distance of around 200 Å. By depositing, finally, some dielectric material in the region defined between two consecutive spacers, a conductive region is realized which can be used for realizing a CMOS transistor.

The above method needs, however, a preliminary and accurate programming since each realization step of an n order (with $n \geq 1$) of spacers is followed by a removal step of the spacers of a previous order (n−1), and it is thus necessary to provide a suitable distance and a suitable thickness of the first spacers for realizing last spacers of desired dimensions.

A different approach to the problem is given by the teaching indicated in the U.S. Pat. Nos. 6,128,214 and 6,314,019, both to Kuekes et al., wherein respectively a memory and communication system by means of nanometric wires arranged transversally on two levels is described. Such wires are joined in the intersections by bi-stable switches which take two different levels according to the potential difference between the respective two wires. Each switch is reconfigurable.

A further nanometric device is known from the U.S. patent application publication No. 2003/0206436 to Eaton et al., wherein memory devices are shown, in particular Flash memory devices wherein a plurality of transistors is realized by means of the intersection between first and second wires realized with semiconductor material. In particular, the first wires are used for realizing respective drain, source and channel regions and the second wires, alternatively realized also with metal, are used for defining the gate electrodes.

Although advantageous in several aspects, this solution results to be limited to the sole realization of memories of the Flash type.

As a matter of fact, in the last years, in the field of the microelectronics, in the perspective of a forward integration, the attention has been addressed towards the use of organic molecules capable of performing the vehicle or vector function for current transport.

For example, in U.S. Pat. No. 6,724,009, in the name of STMicroelectronics, S.r.l., the assignee of the present application, which patent is incorporated herein by reference in its entirety, a method for inserting in an electronic base component, such as a MOS or MOSFET transistor, organic molecules which can be activated as Schmitt trigger, is described.

This solution, although meeting the aim and advantageous for several aspects, needs a base component such as a MOS transistor which thus far has always remained in micrometric dimensions.

BRIEF SUMMARY OF THE INVENTION

One embodiment of the present invention provides a hosting structure of nanometric elements suitable for realizing suitable conduction terminals for said elements, thus forming a nanometric electronic device, as well as the relative manufacturing method, overcoming the dimensional drawbacks cited with reference to the known technique.

In particular, the present invention provides a nanometric structure suitable for realizing conduction terminals for at least one nanometric component, in particular realized on more planes.

One embodiment of the present invention therefore provides a hosting structure comprising:
   a substrate,
   a first multi-spacer level comprising a first plurality of spacers including first conductive spacers parallel to each other, and
   a second multi-spacer level realized above said first multi-spacer level and comprising a second plurality of spacers arranged transversally to said first plurality of spacers and including a first discontinuous insulating layer and an upper layer, including in turn second conductive spacers
   each pair of said spacers of said second multi-spacer level defining, with a spacer of said first multi-spacer level a plurality of nanometric hosting seats having at least a first and a second conduction terminal realized by portions of said first conductive spacers and of said second conductive spacers faced in said hosting seats.

Another embodiment of the present invention provides a method of making a nanometric hosting structure comprising:
   depositing, above a substrate, of a block seed having at least one side wall substantially perpendicular to said substrate;
   repeating n times, with $n \geq 2$, of a step comprising a deposition, on said block seed and on said substrate, of alternating materials, and an anisotropic etching of said deposited layer, with realization, at each repetition, of at least a relative spacer substantially perpendicular to said substrate,
   said alternating materials being different for each pair of consecutive depositions, said n steps defining at least a first multilayer body comprising a plurality of first conductive and first insulating spacers of respectively a conductive material and an insulating material which can be chemically etched in a selective way,
   depositing, above said first multilayer body, of a first insulating layer, defining, above said first insulating layer of a second multilayer body realized, through the steps of:
      deposition of a second block seed on said first insulating layer, and
      repetition of m steps, with $m \geq 3$, each step comprising a deposition of a layer of alternating materials, and an anisotropic etching of said deposited layer, with realization, at each repetition, of a second spacer substantially perpendicular to said first insulating layer,
   said alternating materials being different for each pair of consecutive depositions, said second multilayer body comprising a plurality of second conductive and second insulating spacers realized with at least two materials, respectively a conductive material and an insulating material,
   said second spacers of said second multilayer body being realized transversally with respect to said first spacers of said first multilayer body,
   selective etching with respect to said insulating material of said second multilayer body and of said first insulating layer with removal of second insulating spacers and of exposed portions of said first insulating layer, realizing a plurality of spacers comprising portions of said first insulating layer and said second conductive spacers to form a plurality of nanometric hosting seats having at least a first and a second conduction terminal realized by portions of said first conductive spacers and of said second conductive spacers faced in said hosting seats.

The characteristics and advantages of the hosting structure of nanometric elements and of the method according to the invention will be apparent from the following description of an embodiment thereof given by way of indicative and non-limiting example with reference to the annexed drawings.

DETAILED DESCRIPTION OF THE INVENTION

One embodiment of the present invention provides an electronic device comprising a plurality of nanometric molecular components, as well as a structure on more planes able to host such plurality of molecular components with two or more ends realizing respective conduction and control terminals.

It is to be noted that the process steps described hereafter do not form a complete process flow for the manufacturing of electronic devices. The present invention can be put into practice together with the manufacturing techniques of the electronic devices currently used in the field, and only those steps which are necessary for the understanding of the present invention are included.

Moreover, the figures showing schematic views of portions of an electronic device during the manufacturing are not drawn to scale, but they are instead drawn so as to highlight the important characteristics of the invention.

Figure 1:
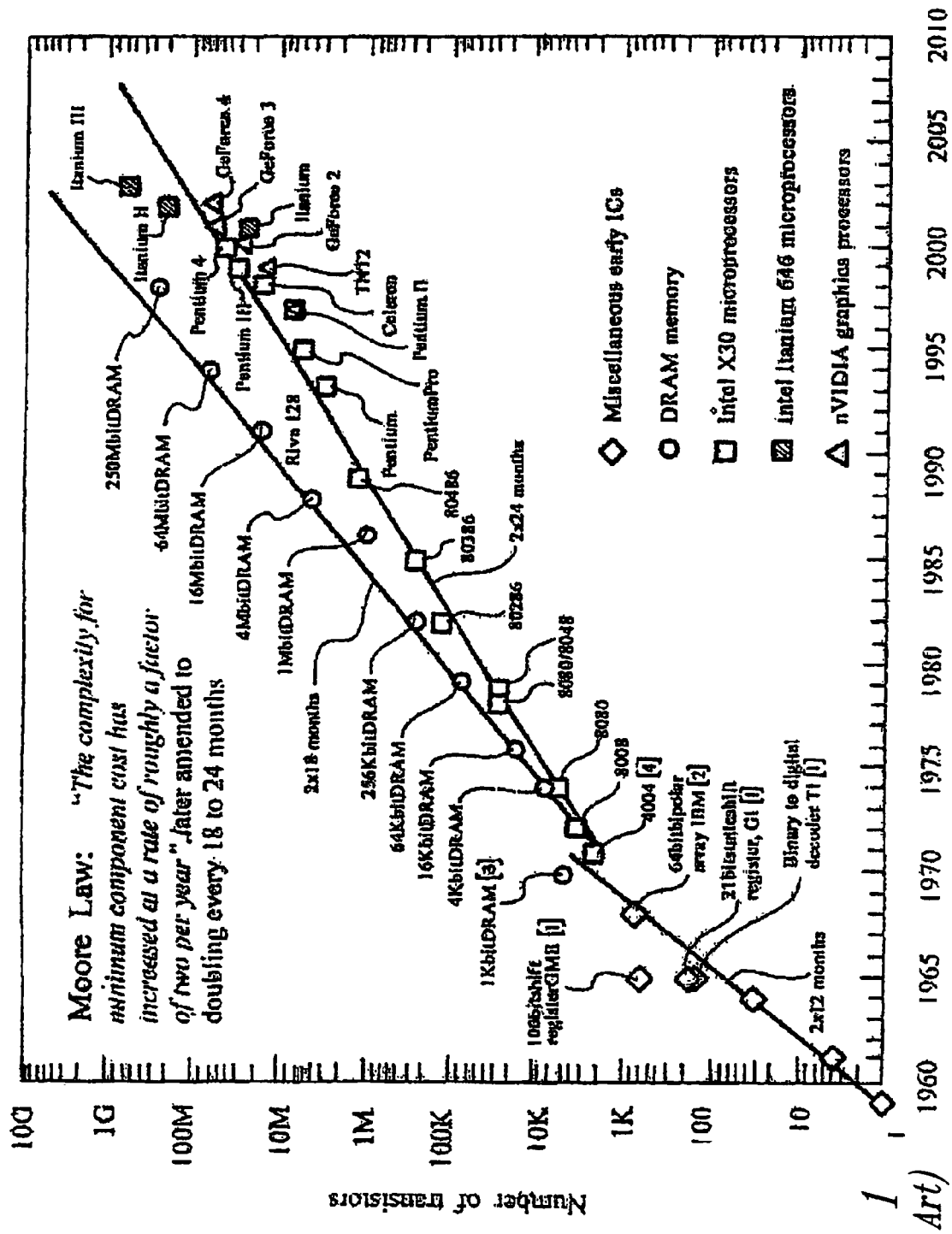
FIG. 1 shows a diagram representing the Moore Law.
Figure 2:
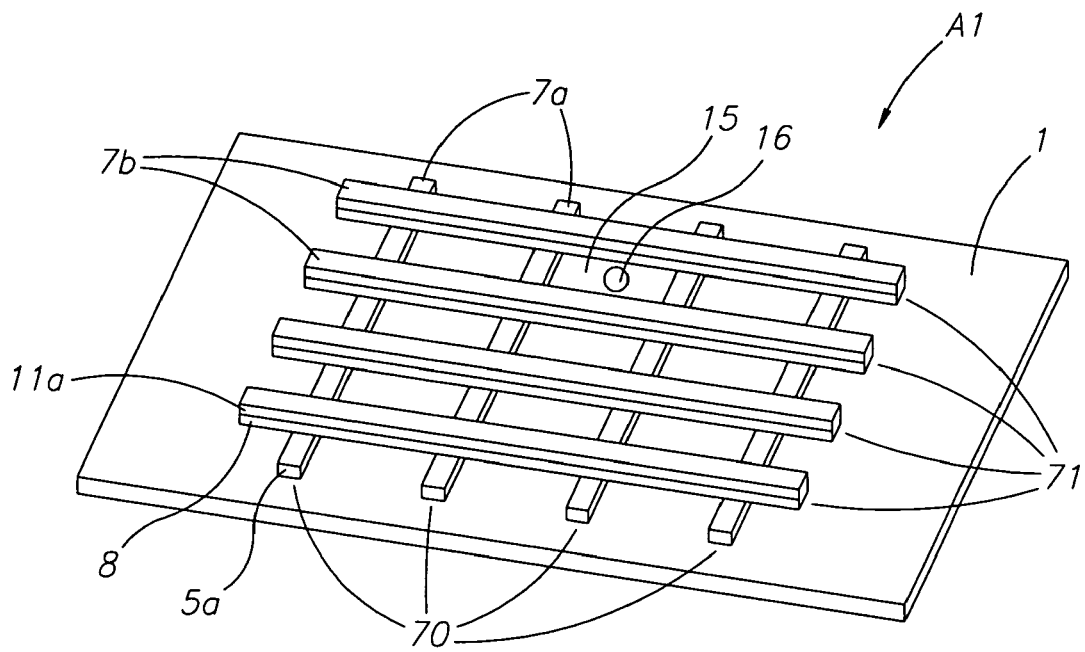
FIG. 2 schematically shows a first embodiment of a hosting structure according to the invention.

A hosting structure of nanometric components realized according to the invention is shown in FIG. 2 and globally indicated with A1.

The structure A1 is realized above a substrate 1, for example formed by an oxide. A1 comprises a first multi-spacer level 70, realized on the substrate 1, and a second multi-spacer level 71, realized on the first multi-spacer level 70.

In particular, the first multi-spacer level 70 comprises in turn a first plurality of spacers 7a, parallel to each other. Similarly, the second multi-spacer level 71 comprises in turn a second plurality of spacers 7b, parallel to each other and suitably arranged transversally with respect to the first plurality of spacers 7a.

In the example indicated in FIG. 2, the second plurality of spacers 7b is arranged perpendicularly with respect to the first plurality of spacers 7a, obviously they could be arranged according to other directions without compromising the functionality of the structure A1.

Advantageously, the spacers 7a of the first multi-spacer level 70 essentially comprise a plurality of bar-like elements or conductive spacers.

Moreover, the spacers 7b of the second multi-spacer level 71 essentially comprise a lower insulating layer 8 and an upper conductive overlapped layer 11a. Advantageously, the lower insulating layer separates the conductive layers of the spacers 7a and 7b of the first 70 and second 71 multi-spacer level, avoiding a short-circuit.

In this way, in the structure A1 a plurality of hosting seats 15 are defined which are suitable for a plurality of nanometric molecular components 16, particularly with two functionalized ends. As used herein, "ends" or "functionalized ends" refers to the end functional groups of a molecule that are capable of bonding or otherwise attaching to conductive and control terminals. A molecule can have any number, preferably two, three or four, functionalized ends.

A hosting seat 15 comprises a bottom portion defined by a portion of a spacer 7a of the first multi-spacer level 70 and side portions defined by portions of a pair of consecutive spacers 7b of the second multi-spacer level 71.

In particular, in each hosting seat 15, the first spacer 7a and at least a second spacer 7b respectively define a first and a second conduction and control terminals for a molecular component hosted therein.

In a preferred embodiment, in the hosting seats 15 only a first and a second conductive portions are provided suitable for defining corresponding conduction terminals of the molecular component, whose arrangement is tied to the configuration of the hosting structure itself. This configuration is essential in the case of hosting seats 15 with dimensions being comparable to the dimensions of the molecular components hosted therein.

Figure 6:
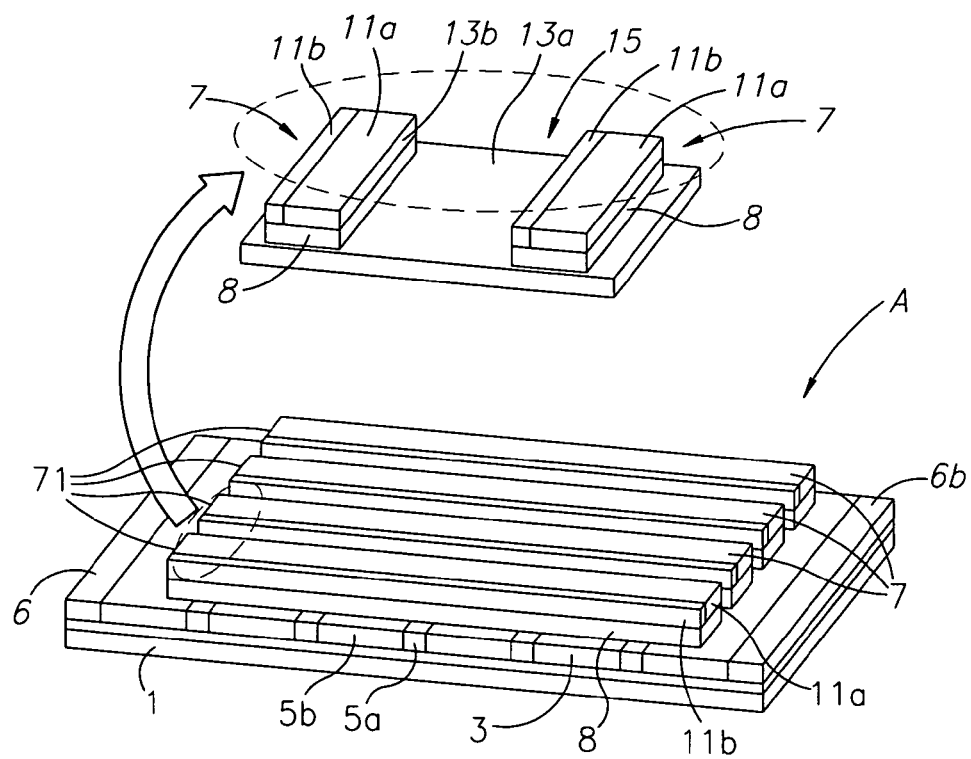
FIG. 6 shows the second embodiment of the hosting structure according to the invention obtained according to the method illustrated in FIGS. 3 to 5.

In this perspective a second embodiment of the hosting structure according to the invention is shown in FIG. 6 and it is globally indicated with A.

In the description of this second embodiment elements being structurally and functionally equal to those of the previously described structure A1 will be given the same reference numbers.

Figure 3:
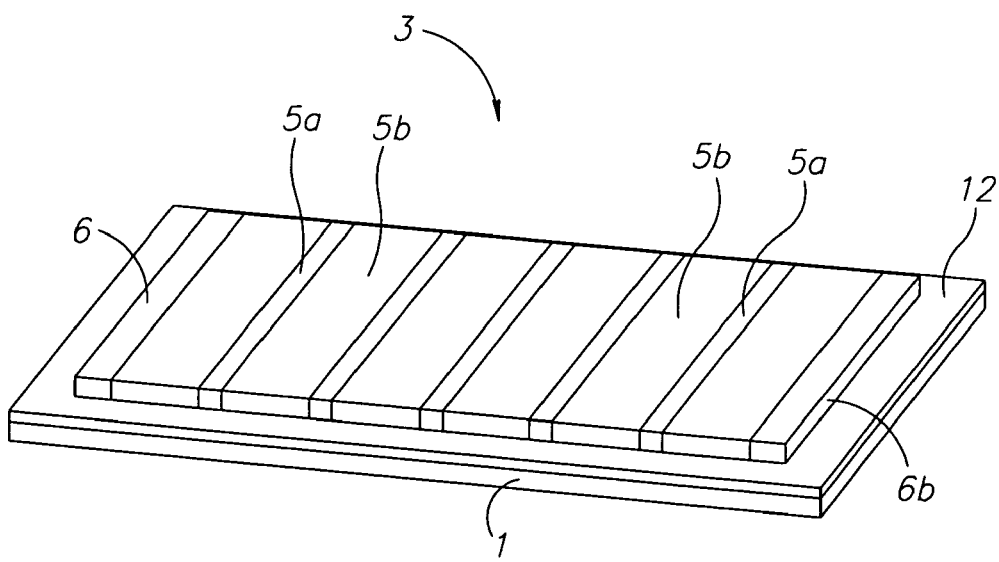
FIGS. 3 to 5 show in sequence some steps of the method for obtaining a second embodiment of the hosting structure according to the invention.

The structure A is realized above a substrate 1 realized for example with an oxide, and it comprises a first multilayer body 3, realized in an upper surface 12 of the substrate 1, as shown in FIG. 3.

The first multilayer body 3 has, in correspondence with a peripheral portion of the upper surface 12, a block seed 6 realized by means of a conventional photolithographic deposition step, squared and having at least one side wall substantially arranged perpendicularly to the upper surface 12 of the substrate 1.

This block-seed 6 is for example realized with a specific material, such as silicon nitride. It is also possible to realize this block-seed 6, and in general any block-seed indicated in the present description, by means of deposition of a plurality of overlapped layers even of different material.

The first multilayer body 3 also has a further terminal block 6b, of dimensions similar to the block seed 6 and realized for example with the same specific material of said block-seed 6.

In this way, this first multilayer body 3 is comprised between blocks 6, 6b and has their same height.

It is also possible to use the further terminal block 6b as further block seed in the realization of the first multilayer body 3.

Essentially, the first multilayer body 3 comprises a plurality of bar-like elements, commonly indicated as spacers, consecutive and parallel to each other. In particular, these first spacers comprise first conductive spacers 5a realized with a conductive material, such as polysilicon, and first insulating spacers 5b realized with an insulating material, such as silicon dioxide.

In one embodiment, the conductive 5a and insulating 5b spacers are arranged in an alternate way to each other, substantially perpendicularly to the upper surface 12 of the substrate 1, and they have defined widths and uniform height substantially corresponding to that of the block seeds 6, 6b.

The structure A comprises, further arranged above the first multilayer body 3, a plurality of spacers 7, parallel to each other and equidistant in pairs, arranged transversally to the first spacers 5a, 5b.

In the example indicated in FIG. 6, the spacers 7 are arranged perpendicularly with respect to the spacers 5a, 5b, obviously they could be arranged along other directions without compromising the functionality of the structure A.

Each spacer 7 comprises a discontinuous insulating layer 8, in contact with the first insulating layer 3, and an upper layer 11, in turn comprising a pair of second spacers, 11a and 11b.

In particular, these second spacers comprise second conductive spacers 11a and second insulating spacers 11b. In a preferred embodiment, the second conductive spacers 11a are realized with the conductive material that realizes the first conductive spacers 5a and the second insulating spacers 11b are realized with the insulating material that forms the first insulating spacers 5b.

In substance, as seen in relation to the hosting structure A1 of FIG. 2, the hosting structure A comprises a first multi-spacer level 70 including in turn the conductive spacers 5a, analogous to 7a in FIG. 2; and a second multi-spacer level 71 including in turn the spacers 7, analogous to 7a in FIG. 2. In particular, similarly to such FIG. 2, the spacers 7 comprise a discontinuous insulating lower layer 8 and an upper layer 11, comprising in turn the second spacers, 11a and 11b.

Suitably, the pairs of second spacers, 11a and 11b, follow each other in a same order along all the spacers 7 so that a second conductive spacer 11a of one spacer 7 is in front of a second insulating spacer 11b of a consecutive spacer 7 in the multi-spacer level.

In this way, a plurality of hosting seats 15 are defined in the structure A suitable for hosting a plurality of nanometric molecular components 16, particularly with two terminals.

A hosting seat 15 comprises a bottom portion defined by a portion of a first conductive spacer 5a and side portions defined by a pair of consecutive spacers 7.

In particular, in each hosting seat 15, the first conductive spacer 5a and the second conductive spacer 11a respectively define a first conduction and control terminal 13a and a second conduction and control terminal 13a for a molecular component 16 hosted therein.

Figure 6A:
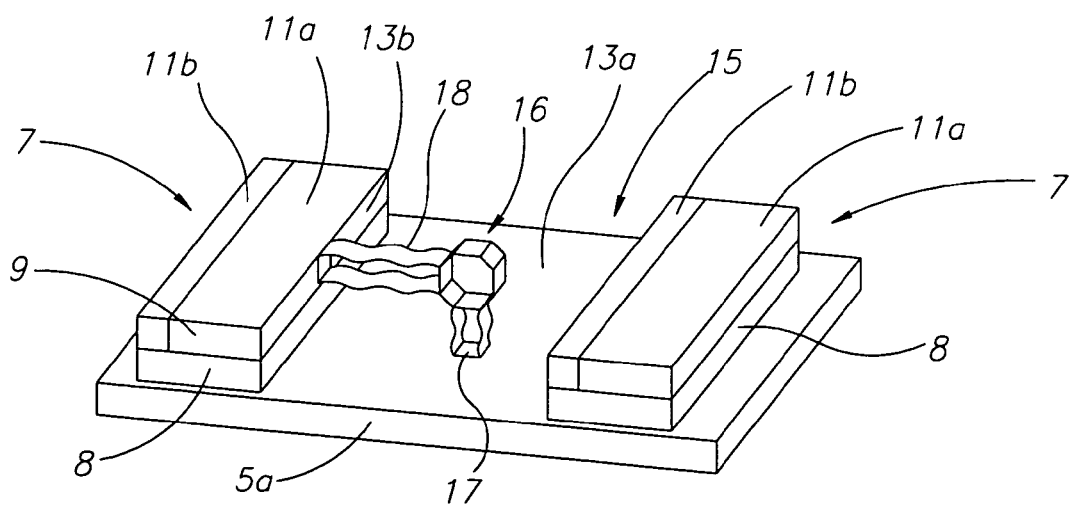
FIG. 6A shows a detail of the hosting structure of FIG. 6 in greater detail.

Advantageously, as highlighted in FIG. 6A, the nanometric molecular component 16 with two ends, is hosted in the seat 15 with a first end 17 bound to the first terminal 13a and a second end 18 bound to the second terminal 13b.

Suitably, the discontinuous insulating layer 8 of each spacer 7 avoids the contact between the first 13a and the second 13b conduction terminal for each seat 15 and in combination with the second insulating spacer 11b, it delimits the conduction terminals 13a and 13b whereto the ends 17 and 18 of the molecular component 16 must be connected.

Figure 13:
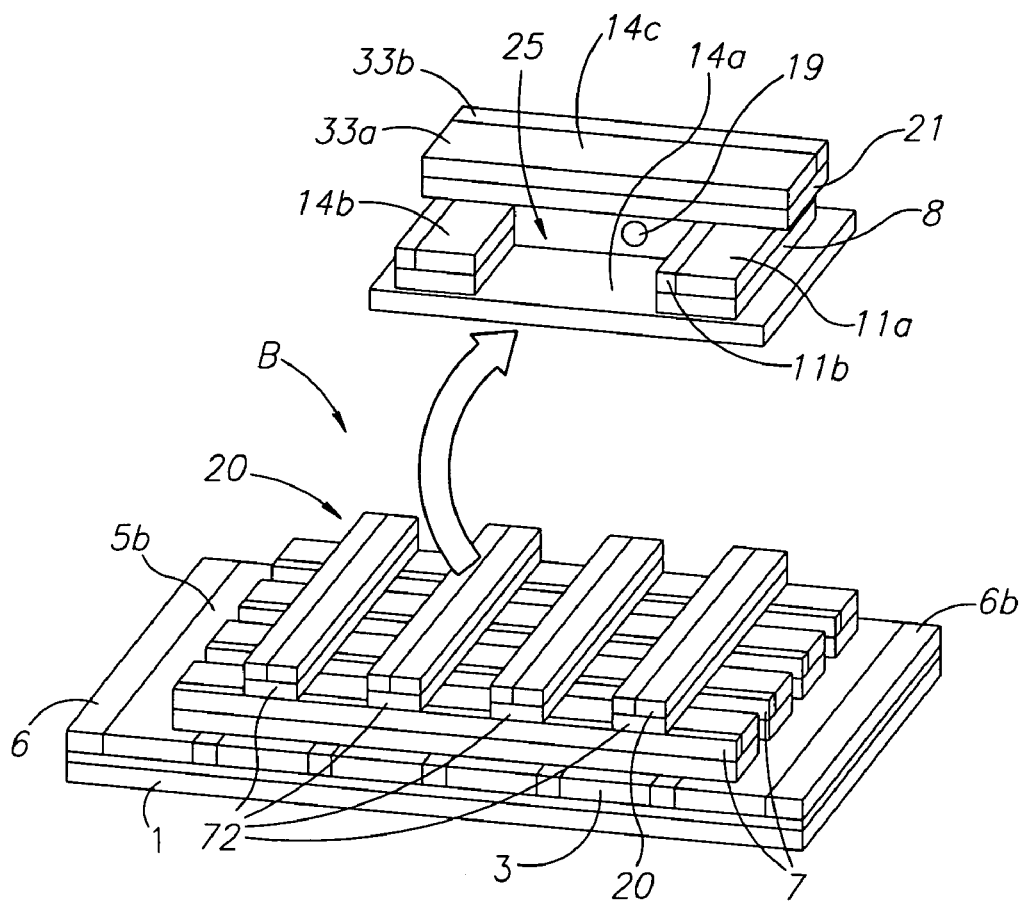
FIG. 13 shows the third embodiment of the hosting structure according to the invention obtained according to the method illustrated in FIGS. 7 to 12.

With reference to FIG. 13, a third embodiment is shown of a hosting structure able to host a plurality of molecular components with more than two ends, globally indicated with B.

In the description of such third embodiment with elements being structurally and functionally equal to those of the structures A1 and A previously described will be given the same reference numbers.

As previously described, also the structure B is realized above an upper surface 12 of a substrate 1.

The structure B comprises a first multilayer body 3 having a block seed 6, a further terminal block 6b and a plurality of first conductive spacers 5a and insulating spacers 5b, consecutive and parallel to each other and arranged, in an alternated way, between the blocks 6 and 6b.

The structure B further comprises, arranged above the first multilayer body 3, a plurality of first spacers 7 transversal with respect to the first spacers 5a, 5b.

Each first spacer 7 comprises a first discontinuous insulating layer 8, in contact with the first multilayer body 3, and an upper body 11, comprising in turn a pair of second conductive spacer 11a and insulating spacers 11b.

In another embodiment, the structure B also comprises, arranged above the plurality of the first spacers 7, a plurality of second spacers 20, parallel to each other and equidistant in pairs, which are arranged transversally to the plurality of first spacers 7.

In the example indicated in FIG. 13 the second spacers 20 are arranged perpendicularly with respect to the first spacers 7 thus resulting to be parallel to the first underlying spacers 5a and 5b. Obviously, the second spacers 20 could be arranged along other directions with respect to the first spacers 7 without compromising the functionality of the structure B.

Suitably each second spacer 20 comprises, similarly to the first spacers 7, a second discontinuous insulating layer 21, in contact with the first spacers 7, and an upper layer, comprising in turn a pair of third spacers, 33a and 33b. In a preferred embodiment, the second discontinuous insulating layer 21 is realized with the insulating material forming the first discontinuous insulating layer 8.

Moreover, these third spacers comprise third conductive spacers 33a and third insulating spacers 33b. In a preferred embodiment, the third conductive spacers 33a are realized with the conductive material realizing the first and the second conductive spacers, 5a and 11a. Moreover the third insulating spacers 33b are realized with the insulating material realizing the first and the second insulating spacers, 5b and 11b.

In substance, as it has been seen in relation to the hosting structures A1 of FIG. 2 and A of FIG. 6, the hosting structure B comprises a first multi-spacer level 70 including in turn spacers realized by the conductive spacers 5a and a second multi-spacer level 71 including in turn the spacers 7. Moreover, the hosting structure B comprises a third multi-spacer level 72 comprising the spacers 20.

In particular, similarly to what has been described above, the spacers 7 comprise a discontinuous insulating lower layer 8 and an upper layer 11, comprising in turn the second spacers, 11a and 11b and the spacers 20 comprise a discontinuous insulating lower layer 21 and an upper layer, comprising in turn the third spacers, 33a and 33b.

Suitably, the pairs of third spacers, 33a and 33b, follow each other in an order along all the second spacers 20 so that a third conductive spacer 33a of one spacer 20 results to be in front of a third insulating spacer 33b of a consecutive spacer 20.

In this way, in the structure B a plurality of hosting seats 25 are defined suitable for hosting a plurality of nanometric molecular components 26, particularly with three ends.

A hosting seat 25 comprises a bottom portion defined by a portion of a first conductive spacer 5a, side portions defined by a pair of consecutive first spacers 7, an upper portion of a second spacer 20.

In one embodiment, as highlighted in the detail of FIG. 13, the hosting seats 25 will be further closed by a plurality of insulating barrier-like elements 19 arranged between the second discontinuous insulating layer 21 and the first underlying conductive spacer 5a. Each barrier-like element 19 is preferably realized with the insulating material realizing the first and the second discontinuous insulating layer 8 and 21.

Moreover, in each hosting seat 25, portions of the first conductive spacer 5a, the second conductive spacer 11a and the third conductive spacer 33a respectively define a first 14a, a second 14b and a third 14c conduction and control terminal for each molecular component 26 housed in this seat 25.

In particular, each hosting seat 25 has three conductive portions defined by the portions of the conductive elements 5a, 11a and 33a, arranged on three distinct and parallel planes and insulated from one another thanks to the insulating portions of the layers 8 and 21 and of the spacers 11b and 33b.

Figure 13A:
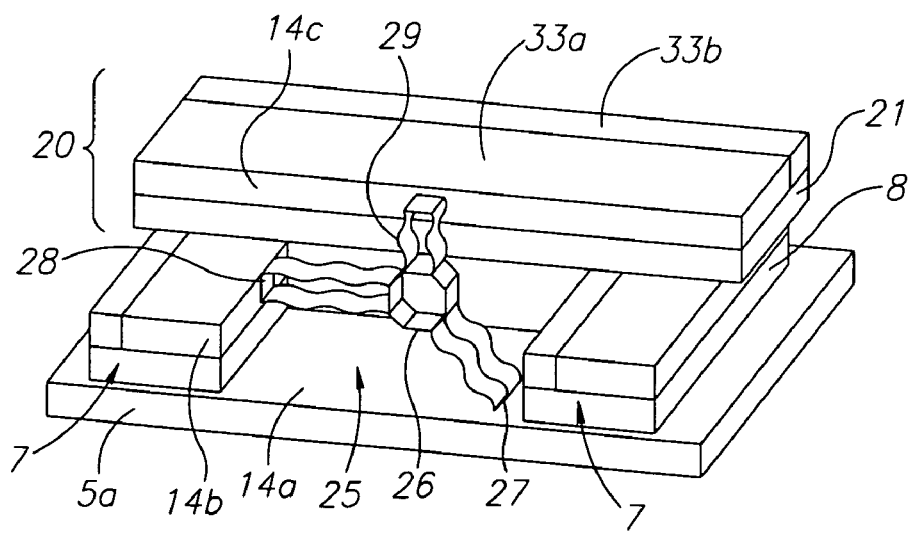
FIG. 13A shows a particular of the hosting structure of FIG. 13 in greater detail.

In one embodiment, as highlighted in FIG. 13A, the molecular component 26 is thus hosted in the hosting seat 25 with a first end 27 bound to the first terminal 14a, a second end 28 bound to the second terminal 14b and a third end 29 bound to the third terminal 14c.

Suitably the first discontinuous insulating layer 8 of the first spacer 7 avoids the contact between the first terminal 14a and the second terminal 14b whereas the second discontinuous insulating layer 21 of the second spacer 20 avoids the contact between the second terminal 14b and the third terminal 14c. Moreover, the combination of insulating layers 8, 11b, 21 and 19 insulates each hosting seat 25 to prevent a molecule 26 from interfering with a molecule hosted in a near hosting seat.

It is also possible to realize a hosting structure comprising any number of overlapped multi-spacer levels.

A main advantage of the hosting structure according to the present invention stays in the nanometric dimensions it has. In particular it stays in the nanometric dimensions conferred to the hosting seats and to the conduction terminals realized by the conductive spacers.

In particular, the conductive spacers define conductive portions of the walls delimiting these hosting seats, and therefore they allow to suitably orient the molecules hosted therein.

Another advantage of the hosting structure according to the invention stays in possibility of orienting molecules having a different number of ends, by varying the number of spacers realized.

A further advantage stays in the possibility of orienting molecules having variable dimensions, by varying the width of the hosting seats; as well as of varying the properties of the conduction terminals, by varying the thickness of the conductive spacers.

Another advantage of the structure according to the invention is that the hosting seats have such a conformation as to ensure, in the presence of suitable insulating materials properly arranged, a correct hosting of the molecules in the seats by directing the molecules ends themselves towards the conduction terminals for a secure and orderly arrangement.

A further advantage of the hosting structure according to the invention, stays in the capacity of hosting and orienting a big number of molecules, each hosted in a hosting seat, realizing in this way an hybrid electronic device having a high integration or density of components.

It is thus possible to realize a nanometric electronic device by providing a nanometric hosting structure as previously described a to host therein a plurality of nanometric components, in particular molecular transistors having respective conduction terminals realized by the conductive spacers of the hosting structure.

In particular, it is possible to provide the hosting structure for hosting molecular components as describe U.S. Pat. No. 6,724,009. By using the method described in such application, the molecular components in the hosting seats of the structure bond in an automatic way to the conductive spacers realizing the conduction terminals.

In one embodiment, the realization of the hosting structure is completed before the hosting therein of the molecular components and of the subsequent realization of the desired hybrid semiconductor device. In this way, the molecular components do not undergo any stress linked to process steps for realizing the hosting structure.

The present invention also relates to a method for manufacturing a nanometric structure as above described.

In particular, in FIGS. 3 to 6, some steps of the method for manufacturing a hosting structure A as above described are shown. Elements being structurally and functionally similar to what has been described with reference to the structure A and to the FIG. 6 will be given the same reference numbers.

In particular, the method according to the present invention provides a deposition step of a block seed 6 above a substrate 1. In particular, this deposition step is a photolithographic deposition step of a specific material, such as silicon nitride, and it comprises a chemical etching step, performed by using for example a solution of $CHF_3/O_2$ for squaring the block seed 6 so that it has at least a side wall substantially perpendicular to an upper surface 12 of the substrate 1.

It is also possible to realize this block seed 6, and in general any block seed indicated in the present description, by means of deposition a plurality of overlapped layers of different material so that it has a side wall substantially perpendicular to an upper surface 12 of the substrate 1.

The method thus provides the realization of first spacers 5a, 5b by repeating n times, with $n \geq 2$, a step comprising a deposition, on the block seed 6 and on the surface 12, of a layer of predetermined thickness of a suitable material, followed by an anisotropic etching of portions the previously deposited layer. Accordingly, after each etching, the layer of deposited material is removed except for a portion defining a spacer adjacent to the block seed 6, during a first step, or to a previously realized spacer, during the subsequent n−1 steps.

These n steps thus define a plurality of spacers 5a, 5b, flanked with each other and suitably realized with two materials alternated with each other, in particular a conductive material and an insulating material, such as for example polysilicon and silicon dioxide.

In one embodiment, the above described step allows to realize first conductive 5a and insulating 5b nanometric spacers, of predetermined widths corresponding to the same thickness of the deposited layer and of heights corresponding to the height of the block seed 6. In particular, as shown in FIG. 2, the spacers 5a, 5b, having the same height, define a first multilayer body 3 with a upper surface being parallel to the substrate 1.

Figure 4:
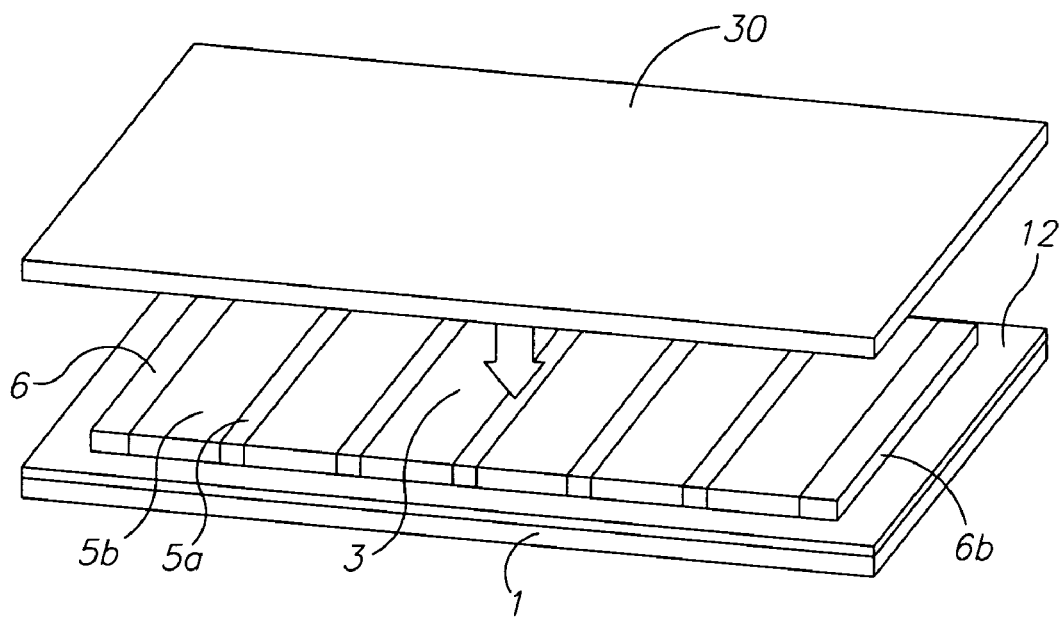

The method thus provides, as shown in FIG. 4, a deposition step, above the first multilayer body 3, of a first insulating layer 30. In particular, a very thin and uniform first insulating layer 30 is preferred, advantageously realized with the specific material realizing the block seed 6.

In particular, in the method according to the invention, a second multilayer body 10 is realized above the first insulating layer 30, as shown in FIG. 4.

The second multilayer body 10 comprises a plurality of second spacers 11a, 11b and it is realized similarly to the first multilayer body 3 by means of the repetition of m steps, with $m \geq 3$, each step comprising a deposition of a layer of predetermined thickness of a suitable material, followed by an anisotropic etching of the deposited layer.

The method initially provides a deposition step of a second block seed (not shown in the figures), realized in a similar way to the first block seed 6 above the first insulating layer 30 and a succession of depositions and etchings to be defined, starting from said second block seed, the second multilayer body 10.

Suitably, these m steps comprise the deposition and the etching of three materials different from one another, and in particular a conductive material as well as a first and a second insulating material to form a succession of second conductive spacers 11a and second insulating spacers 11b and 11c. In a preferred embodiment, this conductive material and second insulating material correspond to those used for realizing the first multilayer body 3, whereas this first insulating material corresponds to the insulating material forming the first insulating layer 30, as well as the spacers 11c and 33c.

It is also possible to provide, in a simplified embodiment of the method according to the invention, that such m steps comprise the deposition and the etching of two materials being different from each other, and in particular a conductive material and an insulating material to form a succession of spacers 7b, as those in the hosting structure A1 of FIG. 2. This simplified method is suitable in particular in the case wherein hosting seats 15 are provided with dimensions remarkably bigger than those of the molecular components hosted therein. In this case in fact, consecutive conductive spacers of a same multi-spacer level, which thus face in a same hosting seat 15, do not prevent the correct arrangement therein of a molecular component.

The second multilayer body 10 is realized with the second spacers 11a, 11b and 11c arranged transversally with respect to the first spacers 5a and 5b of the first multilayer body 3, and in particular perpendicularly thereto.

This is possible by realizing the second block seed arranged transversally with respect to the first block seed and in particular perpendicular thereto.

Obviously the second spacers 11a, 11b and 11c can be arranged along a different direction with respect to the first spacers 5a, 5b.

The method thus provides an etching step of the second multilayer body 10 selective with respect to the first insulating material with removal of the second insulating spacers 11c.

After this removal, a plurality of pairs of second conductive 11a and insulating 11b spacers being flanked and spaced in pairs is realized, said distance corresponding to the width of the second insulating eliminated spacers 11c.

In one embodiment, said selective etching step also removes the first insulating layer 30 except for the part underlying the pairs of second conductive 11a and insulating 11b spacers.

In the case wherein the first insulating layer 30 is realized with a different material to that used for realizing the second insulating spacers 11c, the method will comprise a further selective etching step of this different material with removal of the first insulating layer 30, except for the part underlying the pairs of second conductive 11a and insulating 11b spacers.

Moreover, the above indicated selective etching step can be realized by means of an anisotropic, chemical etching, by means of ionic bombardment or by means of sputtering.

A plurality of spacers 7 is thus realized arranged transversally to the first spacers 5a, 5b of the first multilayer body 3 and formed by two overlapped layers, in particular a first discontinuous insulating layer 8 comprising the parts of the first insulating layer 30 which have not been removed as well as an upper layer 11 comprising the second conductive 11a and insulating 11b spacer.

The nanometric structure A is thus defined and it comprises a plurality of hosting seats 15 for a plurality of molecular components 16, as described with reference to FIG. 6 and FIG. 6A.

The choice of the different materials used, conductive and insulating, depends on the function the structure A must attend to and on the type of molecular component 16 that must be hosted in the seat 15.

Making now reference to FIGS. 7 to 13, a further embodiment of the method according to the invention is described suitable for realizing a hosting structure B for molecular components of the type with three ends, such as for example molecular transistors.

Figure 5:
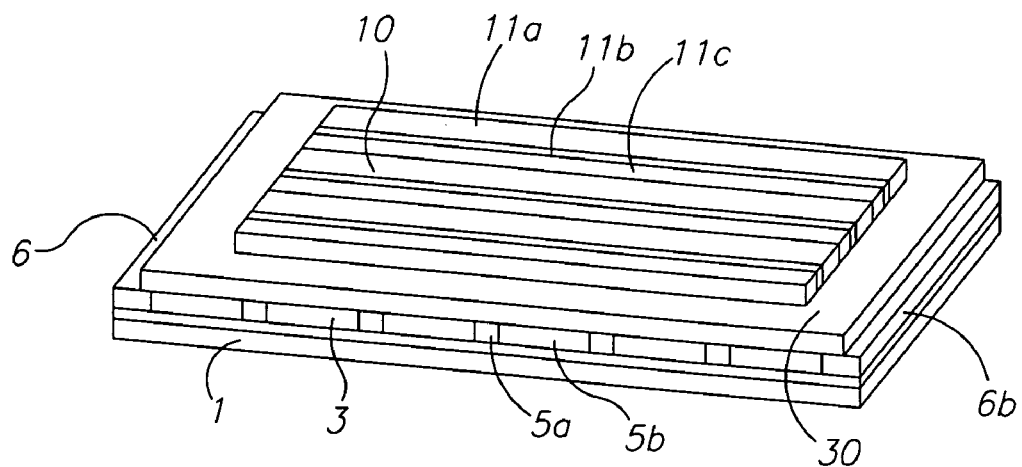
Figure 7:
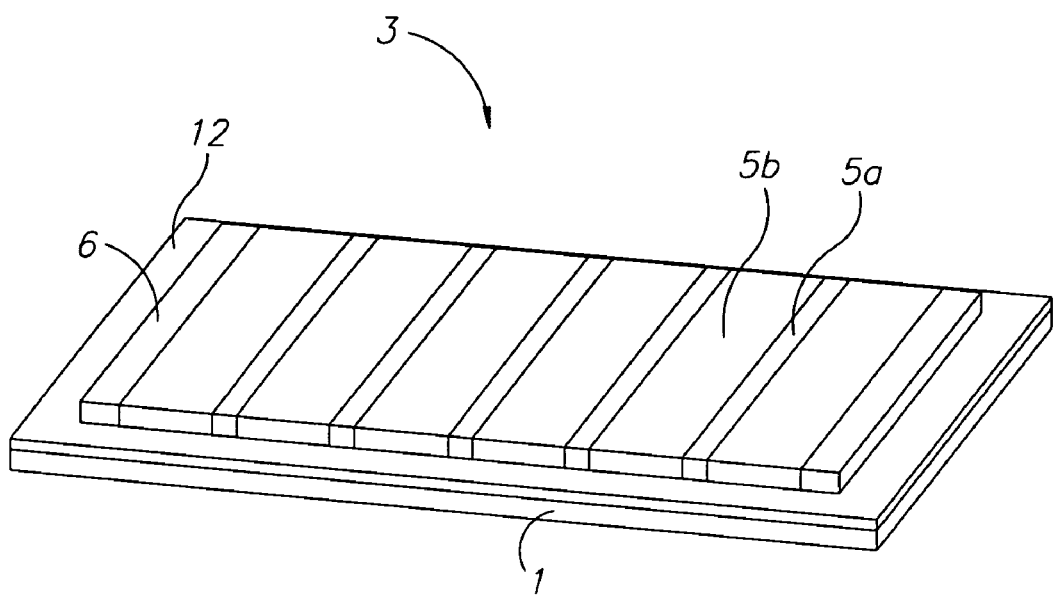
FIGS. 7 to 12 show in sequence some steps of a method to obtain a third embodiment of the hosting structure according to the invention.
Figure 8:
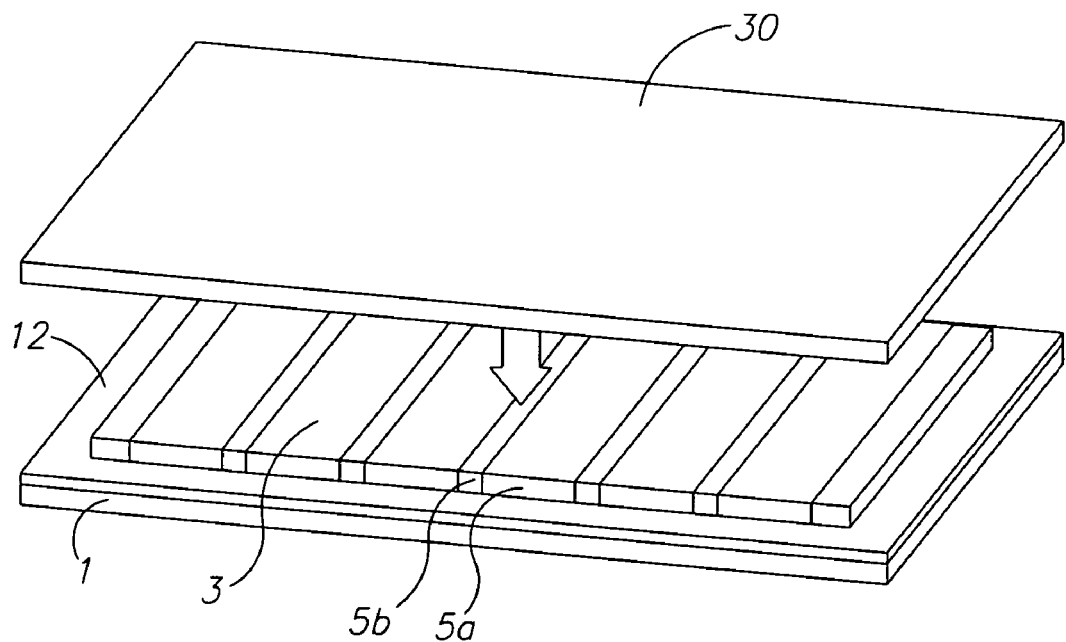
Figure 9:
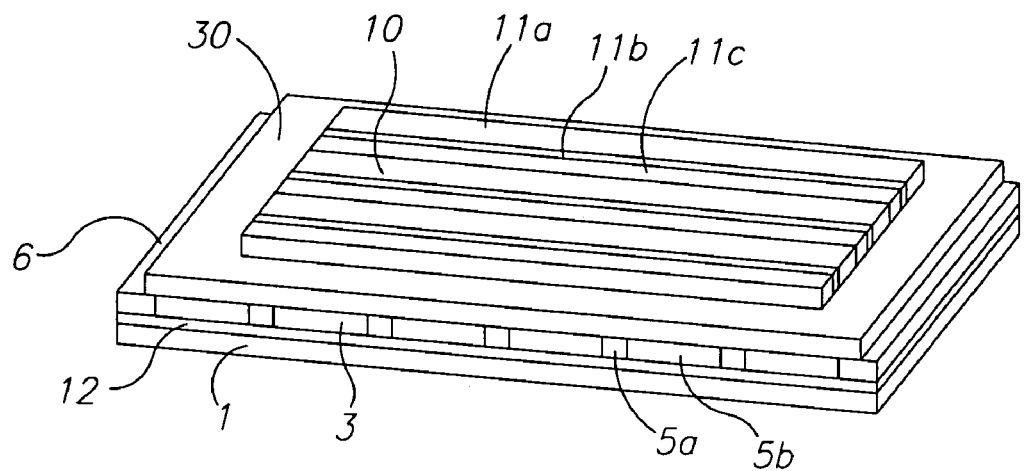

This embodiment of the method provides the steps described in relation to FIGS. 3 to 5, further shown in FIGS. 7 to 9.

Figure 10:
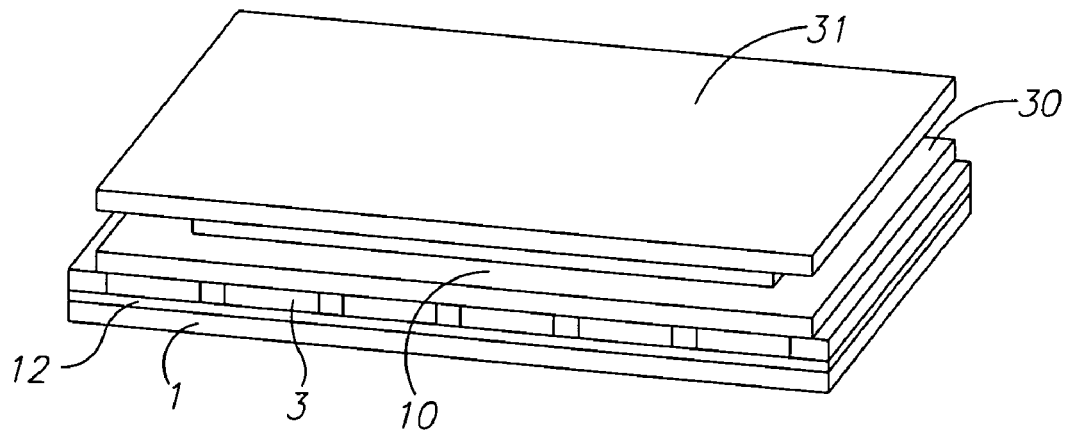
Figure 11:
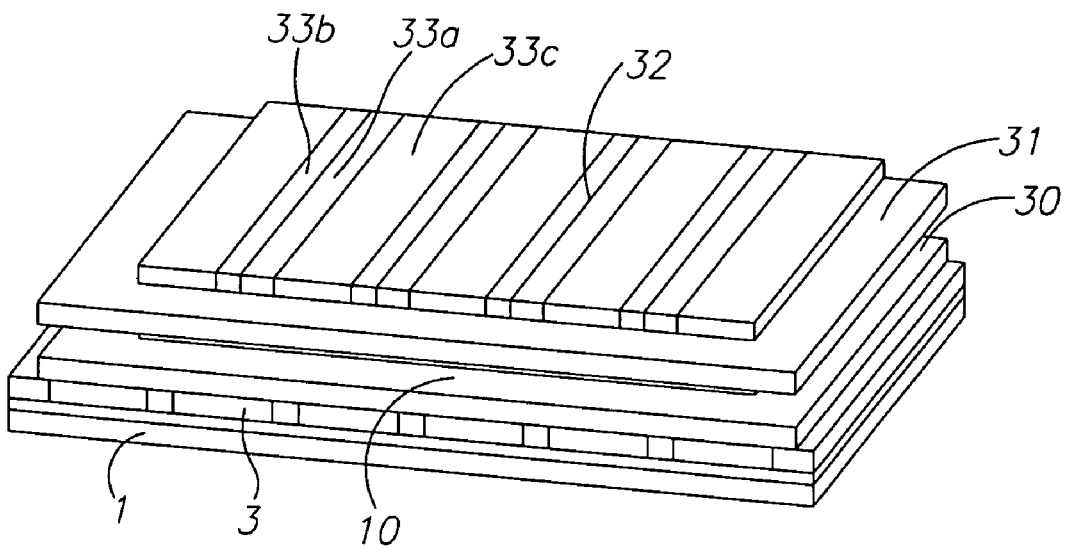
Figure 12:
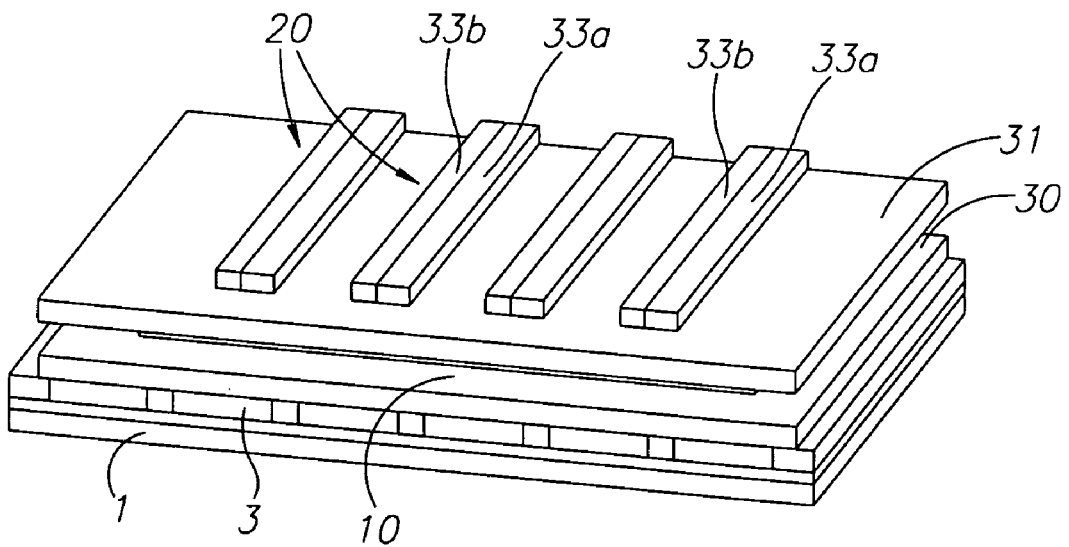

This embodiment of the method thus provides, after the realization of the second multilayer body 10 a deposition step thereon of a second insulating layer 31, as shown in FIG. 10.

In particular, a very thin and uniform second insulating layer 31 is preferred being advantageously realized with the insulating material realizing the first insulating layer 30.

The method thus provides the realization above the second insulating layer 31 of a third multilayer body 32 comprising a plurality of third spacers 33a, 33b and 33c, consecutive to each other and arranged transversally with respect to the second spacers 11a, 11b, 11c of the second multilayer body 10.

As previously seen, also these third spacers 33a, 33c and 33b are realized in a sequence of three suitable materials, advantageously the conductive material, as well as the first and the second insulating material.

In particular, in the further embodiment of the method according to the invention, the third multilayer body 32 is realized, similarly to the first and to the second multilayer body 3, 10, by means of the step m repetition, with m≧3, each step comprising a deposition of a layer of predetermined thickness of a suitable material, followed by an anisotropic etching of the deposited layer.

The method initially provides a deposition step of a third block seed (not shown in the figures), realized in a similar way to the first and to the second block seed above the second insulating layer 31 and a succession of depositions and etchings to define starting from said third block seed, the third multilayer body 32.

Suitably, these m steps comprise the deposition and the etching of three layers different from one another, and in particular with a conductive material and in two different insulating materials to form a succession of third conductive spacers 33a and third insulating spacers 33b and 33c. In a preferred embodiment, these conductive and insulating material correspond to those used for realizing the second multilayer body 10.

As previously, it is possible to provide, in a simplified form of the further embodiment of the method according to the invention, that these m steps comprise the deposition and etching of two materials different from one another, and in particular a conductive material and an insulating material to form a succession of spacers similar to the spacers 7b of the second multi-spacer level 71 of the hosting structure A1 of FIG. 2. This simplified method is suitable in particular in the case wherein hosting seats with remarkably bigger dimensions than those of the molecular components hosted therein are provided.

The third multilayer body 32 is realized with the third spacers 33a, 33b and 33c arranged transversally with respect to the second spacers 11a, 11b and 11c of the second multilayer body 10, and in particular perpendicularly thereto. In this way, this plurality of third spacers 33a, 33b and 33c results to be parallel to the plurality of first spacers 5a, 5b.

This is possible by realizing the third block seed arranged transversally with respect to the second block seed and in particular perpendicular thereto and thus parallel to the first block seed 6.

Obviously the third spacers 33a, 33b and 33c can be arranged along a different direction with respect to the first and to the second spacers.

The choice of the materials of the third spacers 33a, 33b and 33c and the sequential arrangement of the same will be made in relation to the first multilayer body 3 and to the second multilayer body 10. In particular for example the third conductive spacers 33a, are placed so as to have projections on the first multilayer body 3 in positions between first conductive spacers 5a.

The method thus provides a chemical etching step selective with respect to the first insulating material with removal of the third insulating spacers 33c of the third multilayer body 32, of the thus exposed portions of the second insulating layer 31 and of the thus exposed portions of the second insulating spacers 11c of the second multilayer body 10 as well as of the exposed portions of the first insulating layer 30.

The third conductive 33a and insulating 33b spacers, during this etching step, behave as masks for all the underlying portions of first insulating material. Almost the same occurs for the second conductive 11a and insulating 11b spacers.

In this way, a first plurality of parallel spacers 7 are realized parallel to each other and transversally arranged, in particular perpendicularly, and a second plurality of spacers 20, parallel to each other and arranged above the first plurality of spacers 7. As previously seem, the spacers of each plurality respectively comprise a discontinuous insulating layer 8, 21 whereto respective conductive 11a, 33a and insulating 11b, 33b spacers are overlapped.

It is to be noted that portions of the first insulating material, which remain below the second plurality of spacers 20, define plurality of barrier-like elements 19.

The nanometric structure B, as shown in FIG. 13, results thus as defined.

In particular, the thus realized structure B comprises a plurality of hosting seats 25, each comprising a bottom portion defined by a portion of a first conductive spacer 5a, side portions defined by portions of a pair of two consecutive first spacers 7, an upper portion defined by a portion of a second spacer 20 and further closed by a barrier-like element 19.

In this way, in each hosting seat 25 the portions of the first conductive spacer 5a, of the second conductive spacer 11a and of the third conductive spacer 33a respectively define a first 14a, a second 14b and a third 14c conduction and control terminal for a molecular component 26 hosted in this seat 25.

The method according to the invention allows to easily modify the dimensions of the hosting seats and of the conduction terminals therein defined by simply varying the thickness of the deposited and etched layers as well as their deposition order.

Obviously a technician of the field will be able to bring several variations all within the scope of protection of the invention as defined by the claims.

For example it is possible to reiterate the above described method by depositing above the third multilayer body 32, further multilayer bodies, separated from one another by suitable insulating layers. The final selective chemical etching steps on the used insulating materials allow to realize a structure comprising hosting seats equipped with respective conduction and control terminals for molecules with more than three ends.

The dimensions of the spacers and of the insulating layers are nanometric, preferably below 50 nm and most preferably below 10 nm; they are calibrated to the space dimensions and on the type of electric behavior which the molecular component to be hosted performs.

A main advantage of the method according to the present invention is given by the fact of realizing a nanometric hosting structure suitable for hosting and realizing control terminals of nanometric components, in particular molecular transistors.

In particular the method according to the invention allows to realize a plurality of nanometric conduction terminals suitable for controlling the above molecular components and able to suitably orient the molecules realizing them and to order them to perform specific actions.

A further advantage of the present method is that of realizing a hosting structure of the above described type, wherein the plurality of hosting seats and the conduction terminals can be realized with different dimensions.

This structure allows to host molecular components of different nature and dimensions, as well as to test and to ask the single terminals individually.

In particular, the versatility of the method according to the invention stays in that it succeeds in realizing structures of specific and suitable dimensions for the molecular components which are to be hosted, by simply adjusting the thickness of the deposited and etched layers.

A further advantage of the method according to the invention stays in its easiness and speed of realization since steps are provided which can be easily integrated in the productive processes currently in use for obtaining semiconductor devices.

In substance, thanks to the present invention it is possible to realize a nanometric structure, wherein molecules with suitably functionalized ends are hosted in the hosting seats and suitably addressed in correspondence with the conduction terminals in these seats thus realizing a semiconductor device of the hybrid type comprising a plurality of nanometric elements, in particular molecular components.

In substance thanks to the method of the present invention it is possible to realize a nanometric structure for housing millions of electronic components which by means of conduction terminals can be suitably electrically activated according to a specific need, realizing a semiconductor electronic device with different functionalities.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A hosting structure of nanometric components comprising:
   a substrate,
   a first multi-spacer level comprising a first plurality of spacers including first conductive spacers parallel to each other, and
   a second multi-spacer level realized above said first multi-spacer level and comprising a second plurality of spacers arranged transversally to said first plurality of spacers and including a first discontinuous insulating layer and an upper layer, including in turn second conductive spacers
   each pair of said spacers of said second multi-spacer level defining, with a spacer of said first multi-spacer level a plurality of nanometric hosting seats having at least a first and a second conduction terminal realized by portions of said first conductive spacers and of said second conductive spacers faced in said hosting seats.

2. The structure according to claim 1, further comprising a third multi-spacer level including a third plurality of spacers arranged transversally to said second plurality of spacers, each spacer of the third multi-spacer level including a second discontinuous insulating layer and an upper layer, including in turn a third conductive spacers each pair of said spacers of said second multi-spacer level defining with a spacer of said first multi-spacer level and with a spacer of said third multi-spacer level at least one nanometric hosting seat having at least a first, a second an a third conduction terminal realized by portions of said first conductive spacers and of said second conductive spacers and of said third conductive spacers faced in said hosting seat.

3. The structure according to claim 1, wherein said upper layer of said spacers of said second multi-spacer level also comprises second insulating spacers, thereby forming a spacer pair with the second conductive spacer.

4. The structure according to claim 2, wherein said upper layer of said spacers of said third multi-spacer level also comprises third insulating spacers.

5. The structure according to claim 2, wherein said first multi-spacer level further comprising a plurality of first insulating spacer, each being flanked by two adjacent first conductive layers.

6. The structure according to claim 1, wherein each of said spacers of said second multi-spacer level is arranged perpendicularly with respect to said spacers of said first multi-spacer level.

7. The structure according to claim 2, wherein each of said spacers of said third multi-spacer level is arranged perpendicularly with respect to said spacers of said second multi-spacer level.

8. The structure according to claim 1, wherein said spacers of said first multi-spacer level alternate with insulating spacers, which has substantially equal height to said conductive spacers.

9. The structure according to claim 3, wherein said pairs of second conductive and insulating spacers follow each other in a same order along said plurality of spacers of said second multi-spacer level so that a second conductive spacer is in front of a second insulating spacer of a consecutive spacer pair of said second multi-spacer level, defining respective hosting seats.

10. The structure according to claim 3 wherein said second conductive and insulating spacers have substantially equal height.

11. The structure according to claim 2 further comprising a plurality of barrier-like elements, arranged between pairs of said spacers of said second multi-spacer level and below said spacers of said third multi-spacer level.

12. The structure according to claim 1, wherein said first and second conductive spacers are realized with a first conductive material.

13. The structure according to claim 2, wherein said third conductive spacers is realized with a first conductive material.

14. The structure according to claim 3, wherein said second insulating spacers is realized with a first insulating material.

15. The structure according to claim 4, wherein said third insulating spacers is realized with a first insulating material.

16. The structure according to claim 5, wherein said first insulating spacers is realized with a first insulating material.

17. The structure according to claim 1, wherein said first discontinuous insulating spacers is realized with a second insulating material.

18. The structure according to claim 2, wherein said second discontinuous insulating spacers is realized with a second insulating material.

19. The structure according to claim 12, wherein said first conductive is polysilicon.

20. The structure according to claim 14, wherein said first insulating material is silicon dioxide.

21. The structure according to claim 17, wherein said second insulating material is silicon nitride.

22. The structure according to claim 11, wherein said barrier-like elements are realized with insulating material.

23. The structure according to claim 22, wherein said barrier-like elements are realized with silicon nitride.

24. The structure according to claim 2, wherein each of said third conductive spacers is placed so that it has orthogonal projection with respect to said substrate in a position between consecutive first conductive spacers.

25. A nanometric electronic device comprising at least a nanometric component hosted in a hosting structure, having:
a substrate,
a first multi-spacer level comprising a first plurality of spacers including first conductive spacers parallel to each other, and
a second multi-spacer level realized above said first multi-spacer level and comprising a second plurality of spacers arranged transversally to said first plurality of spacers and including a first discontinuous insulating layer and an upper layer, including in turn second conductive spacers
each pair of said spacers of said second multi-spacer level defining, with a spacer of said first multi-spacer level a plurality of nanometric hosting seats having at least a first and a second conduction terminal realized by portions of said first conductive spacers and of said second conductive spacers faced in said hosting seats
wherein said conductive spacers of said hosting structure defining respective conduction terminals of said at least one nanometric component.

26. The nanometric electronic device of claim 25 wherein each of the hosting seats has a width less than 50 nm, and the nanometric component is a molecule having functionalized end groups capable of being coupled to respective conductive spacers.

27. A hosting structure for hosting nanometric components, comprising:
a substrate;
a first layer having a plurality of alternating first conductive spacers and first insulating spacers; and
a first array of spacer bars being arranged transversely on top of the first layer, each of said spacer bars comprising a first spacer pair overlying a first insulating layer, said spacer pair having a second conductive spacer adjoining a second insulating spacer wherein, the second conductive spacers alternate with the second insulating spacers across the first array of spacer bars.

28. The hosting structure of claim 27 wherein two adjacent spacer bars of the first array define a plurality of gaps, each gap and a respective conductive spacer having substantially the same width and being arranged such that the gap allows for the exposure of the respective first conductive spacer, thereby providing a plurality of hosting seats.

29. The hosting structure of claim 27 wherein the first and second conductive spacers are formed of the same conductive material.

30. The hosting structure of claim 27 wherein the first and second insulating spacer are formed of the same insulating material.

31. The hosting structure of claim 28 wherein each hosting seat accommodates a nanometric element therein.

32. The hosting structure of claim 28 further comprising:
a second array of spacer bars being arranged transversely on top of the first array of spacer bars, each of said spacer bars comprising a second spacer pair overlying a second insulating layer, said spacer pair having a third conductive spacer adjoining a third insulating spacer wherein, the third conductive spacers alternate with the third insulating spacers across the second array of spacer bars, and each hosting seat is further defined by a respective third conductive spacer.

33. The hosting structure of claim 31 wherein the nanometric element is a molecule having two functionalized ends, each attaching to a respective first and second conductive spacers which define the hosting seat.

34. The hosting structure of claim 32 wherein the first, second conductive spacer are formed of the same conductive material.

35. The hosting structure of claim 32 wherein the second and third insulating spacers are formed of different insulating material.

36. The hosting structure of claim 32 wherein each hosting seat accommodates a nanometric element therein.

37. The hosting structure of claim 36 wherein the nanometric element is a molecule having three functionalized ends, each attaching to a respective first, second and third conductive spacers which define the hosting seat.

* * * * *

UNITED STATES PATENT AND TRADEMARK OFFICE
CERTIFICATE OF CORRECTION

| | |
|---|---|
| PATENT NO. | : 7,456,508 B2 |
| APPLICATION NO. | : 11/215348 |
| DATED | : November 25, 2008 |
| INVENTOR(S) | : Danilo Mascolo et al. |

It is certified that error appears in the above-identified patent and that said Letters Patent is hereby corrected as shown below:

Column 14
Lines 24-25, "including in turn a third conductive spacers each pair of said spacers of" should read as -- including in turn third conductive spacers each pair of said spacers of --

Lines 40-42, "wherein said first multi-spacer level further comprising a plurality of first insulating spacer," should read as -- wherein said first multi-spacer level further comprises a plurality of first insulating spacers, --

Lines 53-54, "spacers of said first multi-spacer level alternate with insulating spacers, which has substantially equal height to said conductive" should read as -- spacers of said first multi-spacer level alternate with insulating spacers, which have substantially equal height to said conductive --

Column 15
Lines 6-7, "wherein said third conductive spacers is realized with a first conductive material" should read as -- wherein said third conductive spacers are realized with a first conductive material --

Line 9, "insulating spacers is realized with a first insulating material" should read as -- insulating spacers are realized with a first insulating material --

Line 11, "insulating spacers is realized with a first insulating material" should read as -- insulating spacers are realized with a first insulating material --

Line 13, "insulating spacers is realized with a first insulating material" should read as -- insulating spacers are realized with a first insulating material --

Line 15, "discontinuous insulating spacers is realized with a second" should read as -- discontinuous insulating layer is realized with a second --

Line 18, "discontinuous insulating spacers is realized with a second" should read as -- discontinuous insulating layer is realized with a second --

UNITED STATES PATENT AND TRADEMARK OFFICE
CERTIFICATE OF CORRECTION

| | |
|---|---|
| PATENT NO. | : 7,456,508 B2 |
| APPLICATION NO. | : 11/215348 |
| DATED | : November 25, 2008 |
| INVENTOR(S) | : Danilo Mascolo et al. |

It is certified that error appears in the above-identified patent and that said Letters Patent is hereby corrected as shown below:

Lines 20-21, "The structure according to claim 12, wherein said first conductive is polysilicon." should read as -- The structure according to claim 12, wherein said first conductive material is polysilicon. --

Lines 53-54, "wherein said conductive spacers of said hosting structure defining respective conduction terminals of said at least" should read as -- wherein said conductive spacers of said hosting structure define respective conduction terminals of said at least --

Column 16
Lines 13-14, "a second insulating spacer wherein, the second conductive spacers alternate with the second insulating spacers" should read as -- a second insulating spacer, wherein second conductive spacers alternate with second insulating spacers --

Line 20, "for the exposure of the respective first conductive spacer," should read as -- for the exposure of the respective conductive spacer, --

Line 26, "second insulating spacer are formed of the same insulating" should read as -- second insulating spacers are formed of the same insulating --

Lines 36-37, "the third conductive spacers alternate with the third insulating spacers across the second array of spacer bars," should read as -- third conductive spacers alternate with third insulating spacers across the second array of spacer bars, --

Lines 42-43, "each attaching to a respective first and second conductive spacers which define the hosting seat." should read as -- each attaching to a respective first and second conductive spacer which define the hosting seat. --

Lines 44-45, "wherein the first, second conductive spacer are formed of the same conductive" should read as -- wherein the first and second conductive spacers are formed of the same conductive --

UNITED STATES PATENT AND TRADEMARK OFFICE
CERTIFICATE OF CORRECTION

PATENT NO. : 7,456,508 B2
APPLICATION NO. : 11/215348
DATED : November 25, 2008
INVENTOR(S) : Danilo Mascolo et al.

It is certified that error appears in the above-identified patent and that said Letters Patent is hereby corrected as shown below:

Lines 54-55, "each attaching to a respective first, second and third conductive spacers which define the hosting seat." should read as -- each attaching to a respective first, second and third conductive spacer which define the hosting seat. --

Signed and Sealed this

Thirty-first Day of March, 2009

JOHN DOLL
*Acting Director of the United States Patent and Trademark Office*